United States Patent [19]
Plant

[11] 3,944,935
[45] Mar. 16, 1976

[54] APPARATUS FOR GENERATING A D.C. SIGNAL PROPORTIONAL TO AN INPUT FREQUENCY

[75] Inventor: Anthony Brian Plant, Birmingham, England

[73] Assignee: Joseph Lucas (Industries) Limited, Birmingham, England

[22] Filed: Nov. 26, 1974

[21] Appl. No.: 527,235

[52] U.S. Cl. ............... 328/140; 307/271; 307/275; 328/132; 328/141
[51] Int. Cl.² ................ H03B 3/04; H03K 5/20
[58] Field of Search ............... 328/135, 140, 141; 307/271, 295, 132, 133

[56] References Cited
UNITED STATES PATENTS

| | | | |
|---|---|---|---|
| 3,461,392 | 8/1969 | Hughes et al. | 328/140 X |
| 3,663,885 | 5/1972 | Stewart | 328/140 |
| 3,693,097 | 9/1972 | Band | 328/140 |
| 3,798,529 | 3/1974 | Jones | 328/140 |
| 3,820,032 | 6/1974 | Schlaeppi | 328/140 |

OTHER PUBLICATIONS

"Computers in Control and Data Processing" by Davis of Process Control and Automation, June 1964, pp. 249–252, part 3, Hybrid Computers, British Publication.

*Primary Examiner*—Saxfield Chatmon, Jr.
*Attorney, Agent, or Firm*—Holman & Stern

[57] ABSTRACT

An apparatus for generating a d.c. output signal which is proportional to the frequency of an alternating input signal, includes a pulse generator and a counter arranged to count pulses from the generator for a time which is dependent on the input signal frequency. A digital to analog converter is responsive to the count in the counter and also to the d.c. output signal to provide an intermediate d.c. signal which is compared with a d.c. reference signal. The difference between the intermediate and reference signals is integrated to provide the output signal. The arrangement is such that the d.c. output signal is directly proportional to the input signal frequency.

8 Claims, 2 Drawing Figures

APPARATUS FOR GENERATING A D.C. SIGNAL PROPORTIONAL TO AN INPUT FREQUENCY

This invention relates to an apparatus for generation of a d.c. output signal having a magnitude which is proportional to the frequency of an electrical input signal.

According to the invention an apparatus for generating a d.c. output signal whose magnitude is proportional to the frequency of an electrical input signal comprises means for generating a train of substantially equispaced electrical pulses, a pulse counter, means, responsive to said input signal, for gating said pulses to said counter for a time interval which is dependent on the frequency of said input signal, a digital to analog converter for providing a first d.c. signal dependent on the count in said counter at the end of one of said time intervals, a summing junction responsive to said first d.c. signal and to an electrical reference signal to generate a control signal proportional to the difference between said first d.c. signal and said reference signal, and an integrating circuit responsive to said control signal to generate said output signal, said digital to analog converter also being responsive to said output signal so that said first d.c. signal is proportional to the product of said count and said output signal, and the arrangement being such that variations in said first d.c. signal are opposed by corresponding changes in said output signal.

Examples of the invention will now be described with reference to the accompanying drawings, in which.

Figure 1:
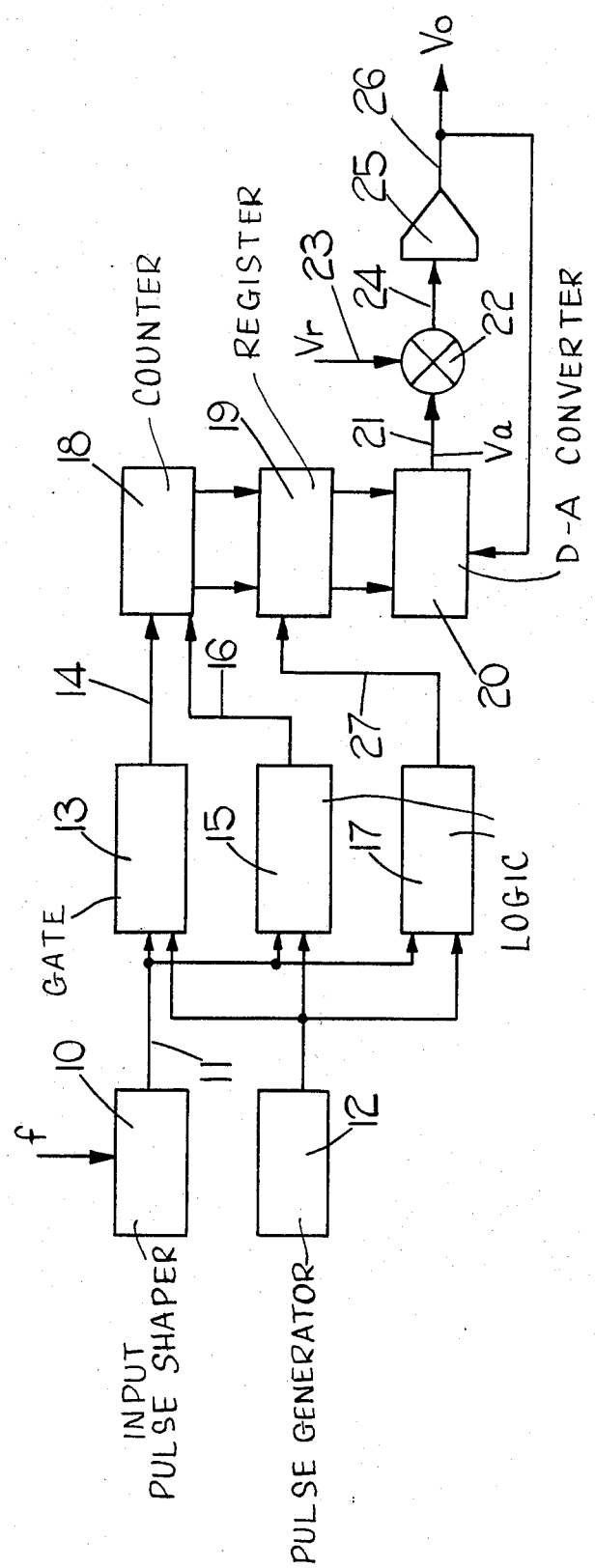
FIG. 1 shows an apparatus for generating a single d.c. output signal.

The apparatus shown in FIG. 1 has a pulse shaper 10 which is responsive to an input signal of frequency $f$ to provide, on a line 11, a train of shaped pulses having input frequency $f$, the duration of these pulses being one half-cycle of the input signal. A pulse generator 12 is operable to provide an output of equispaced pulses. A gate circuit 13 is responsive to a pulse on line 11 to provide, on a line 14, a train of pulses from circuit 12 for a duration equal to one half-cycle of the frequency $f$. The frequency $fp$ of the pulses from circuit 12 is 500 times greater than the highest anticipated value of frequency $f$.

A logic circuit 15 is responsive to the pulses from generator circuit 12 and to the pulses from shaper 10 to provide, on a line 16, a control signal which coincides with the second of the pulses from circuit 12 to occur after the end of a pulse from shaper 10. The signal on line 16 resets the value in a counter 18 to zero so that the next pulse train on line 14 is counted by counter 18.

A further logic circuit 17 is also responsive to the pulses from circuit 12 and from shaper circuit 10 to provide, on a line 27 to a register 19, a control signal which coincides with the second of the pulses from circuit 12 to occur after the end of a pulse from shaper 10. The signal on line 27 thus precedes that on line 16 and causes the value in counter 18 to be loaded into register 19, before counter 18 is cleared.

A digital-to-analog converter 20 is responsive to the value N in register 19, to provide a d.c. output voltage Va on a line 21, this voltage Va being proportional to frequency f. A summing circuit 22 is responsive to the voltage Va and also to a reference voltage Vr of opposite sign to voltage Va. Circuit 22 provides, on a line 24, a voltage signal dependent on the difference between voltages Va and Vr. An integrater circuit 25 is responsive to the output of summing circuit 22 to provide, on a line 26, a voltage output signal Vo for the apparatus as a whole. The converter 20 is also responsive to the output signal Vo so that the analog voltage Va on line 21 is, in fact, proportional to the product of the count in register 19 and the output signal Vo, any variation in Va being opposed by a corresponding variation in the signal Vo.

The voltage on line 21 may thus be expressed as:

$$Va = K_1 N Vo \qquad (1)$$

The operation of the integrater circuit 25 and summing circuit 22 has the effect that, in a steady state condition, $Va = Vr$, in which condition the signal on line 24 is zero. Equation (1) above may thus be written:

$$Vo = Vr/K_1 N \qquad (2)$$

$$= Vr/K_1 \cdot K_2 t \qquad (3)$$

where $t$ is the periodic time of the frequency $f$, and, since $f \sim 1/t$ $$Vo = Vr \cdot f / K_1 K_2 \qquad (4)$$

The output voltage Vo may thus be proportional to frequency $f$ only, when Vr is maintained constant, or proportional to the product of frequency $f$ and a coefficient, voltage Vr being set equal to the desired coefficient.

Figure 2:
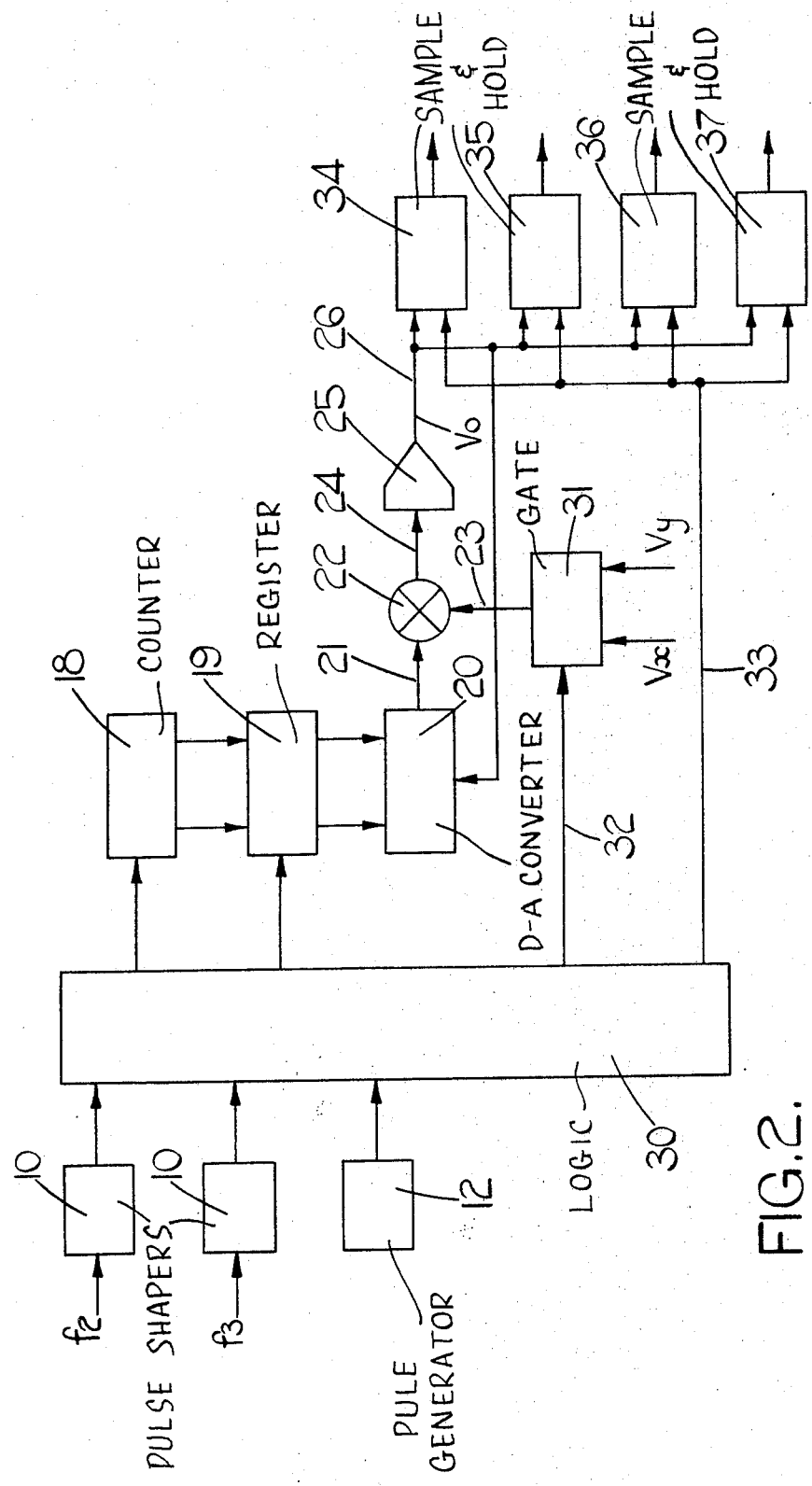
FIG. 2 shows an apparatus for selectively generating a plurality of d.c. output signals.

FIG. 2 shows an apparatus generally similar to that previously described, similar items being assigned identical reference numbers. The apparatus of FIG. 2 is adapted to provide a plurality of output signals. Some of these output signals are proportional only to corresponding input signals, and others of the output signals are also proportional to coefficients as indicated with reference to FIG. 1.

Pulse shapers 10 are respectively responsive to input frequencies $f_2$ and $f_3$. A logic arrangement 30 includes a gate 13 and a clock circuit 15 as indicated in FIG. 1. Logic arrangement 30 is, however, responsive to pulses from the generator 12 to load counter 18 alternatively with pulse trains from input frequencies $f_2$, $f_3$, and also to load register 19 as described.

The voltage applied to line 23 is derived, via a gate circuit 31, from either one of two different input voltages Vx, Vy. The one of voltages Vx, Vy which is applied to line 23 is selected by a signal on a line 32 from logic circuit 30. It is arranged that voltage Vx is constant and has the effect, in conjunction with the aforementioned constants $K_1$, $K_2$, that voltage Vo is proportional only to the selected one of frequencies $f_2, f_3$. The application of voltage Vy has the effect that Vo is proportional to the product of the selected frequency and a coefficient y dependent on voltage Vy.

The output voltages Vo are stored in selected ones of four sample and hold devices 34, 35, 36, 37, under control of signals on a group of lines 32 from logic circuit 30. It is arranged that the values in devices 34, 35, 36, 37 are respectively proportional to $f_2$; $yf_2$; $f_3$ and $y.f_3$.

The use of the analog-to-digital converter 20, as indicated by equation (2) to provide a signal which forms the denominator of the output voltage expression, enables the output voltage to be readily made directly proportional to the input frequency.

It will be understood that, since the value of the output signal V$o$, in both the foregoing embodiments, is proportional to the frequency $fp$ of the pulses from generator 12, V$o$ may further be varied by variation of frequency $fp$. Generator 12 may thus include means for varying frequency $fp$ to provide a further coefficient, in addition to the aforementioned coefficient $y$.

It will also be understood that, with reference to the apparatus shown in FIG. 1, the reference voltage V$r$ may be generated by selection from a number of preset voltages, in a like manner to that shown and described with reference to FIG. 2.

I claim:

1. An apparatus for generating a d.c. output signal whose magnitude is proportional to the frequency of an electrical input signal, comprising means for generating a train of substantially equispaced electrical pulses, a pulse counter, gating means responsive to said input signal for gating said pulses to said counter for a time interval which is dependent on the frequency of said input signal, a digital to analog converter for providing a d.c. signal dependent on the count in said counter at the end of said time interval, a summing junction responsive to said d.c. signal and to an electrical reference signal to generate a control signal proportional to the difference between said d.c. signal and said reference signal, and an integrating circuit responsive to said control signal to generate said output signal, said digital to analog converter also being responsive to said output signal so that said d.c. signal is proportional to the product of said count and said output signal, and a feedback arrangement provided such that variations in said d.c. signal are opposed by corresponding changes in said output signal.

2. An apparatus as claimed in claim 1 in which said means responsive to the input signal comprises means for generating a sequence of shaped pulses having a frequency dependent to the input frequency, and a gate circuit, responsive to said shaped pulses, for applying said train of pulses to said counter, said time interval being equal to the duration of one of said shaped pulses.

3. An apparatus as claimed in claim 2 in which each said shaped pulse has a duration substantially equal to one half cycle of said input signal.

4. An apparatus as claimed in claim 2 which includes a register adapted to receive the count in said counter, and means, responsive to said shaped pulses, for loadin said count into said register at the end of one of said time intervals, and for subsequently setting said count to a predetermined value.

5. An apparatus as claimed in claim 2 which includes a plurality of means for generating sequences of shaped pulses having frequencies dependent on respective ones of a plurality of input signals, in which said gate circuit comprises means, sequentially responsive to shaped pulses from respective ones of said plurality of pulse-generating means, for applying said train of pulses to said counter, and which includes a plurality of sample and hold devices, and means for sequentially operating said sample and hold devices to store respective output signals corresponding to respective one of said input signals.

6. An apparatus as claimed in claim 5 which includes means for selecting said reference voltage from a plurality of input voltages.

7. An apparatus as claimed in claim 1 which includes means for selecting said reference voltage from a plurality of input voltages.

8. An apparatus as claimed in claim 1 in which said pulse-train generating means includes means for varying the frequency of said pulse train.

* * * * *

UNITED STATES PATENT AND TRADEMARK OFFICE
CERTIFICATE OF CORRECTION

PATENT NO. : 3,944,935
DATED : March 16, 1976
INVENTOR(S) : Anthony Brian Plant

It is certified that error appears in the above-identified patent and that said Letters Patent are hereby corrected as shown below:

[30] Foreign Priority Data:
Great Britain No. 55602/73 filed November 30, 1973

Signed and Sealed this eighteenth Day of May 1976

[SEAL]

Attest:

RUTH C. MASON
Attesting Officer

C. MARSHALL DANN
Commissioner of Patents and Trademarks